(12) United States Patent
Henry et al.

(10) Patent No.: US 7,948,819 B2
(45) Date of Patent: May 24, 2011

(54) INTEGRATED CIRCUIT HAVING A MEMORY WITH PROCESS-VOLTAGE-TEMPERATURE CONTROL

(75) Inventors: Mathew R. Henry, Fogelsville, PA (US); Douglas D. Lopata, Boyertown, PA (US); Richard J. McPartland, Nazareth, PA (US); Hai Quang Pham, Hatfield, PA (US); Wayne E. Werner, Coopersburg, PA (US)

(73) Assignee: Agere Systems Inc., Allentown, PA (US)

( * ) Notice: Subject to any disclaimer, the term of this patent is extended or adjusted under 35 U.S.C. 154(b) by 571 days.

(21) Appl. No.: 11/860,891

(22) Filed: Sep. 25, 2007

(65) Prior Publication Data
US 2008/0117702 A1    May 22, 2008

Related U.S. Application Data

(60) Provisional application No. 60/866,738, filed on Nov. 21, 2006.

(51) Int. Cl.
| G11C 7/22 | (2006.01) |
| G11C 8/18 | (2006.01) |
| G11C 7/04 | (2006.01) |
| G11C 7/02 | (2006.01) |

(52) U.S. Cl. ............... 365/202; 365/194; 365/210.11; 365/211

(58) Field of Classification Search .............. 365/194, 365/202, 210.11, 211
See application file for complete search history.

(56) References Cited

U.S. PATENT DOCUMENTS

| 7,130,227 B2 | 10/2006 | Nobunaga et al. | |
| 7,193,910 B2 | 3/2007 | Nobunaga et al. | |
| 2002/0066047 A1* | 5/2002 | Olarig et al. | 713/323 |
| 2005/0117413 A1* | 6/2005 | Kang | 365/194 |

FOREIGN PATENT DOCUMENTS
WO    PCTUS06/61323    11/2006

* cited by examiner

*Primary Examiner* — J. H. Hur
(74) *Attorney, Agent, or Firm* — Mendelsohn, Drucker & Associates, P.C.; Yuri Gruzdkov; Steve Mendelsohn

(57) ABSTRACT

Certain embodiments of the inventions provide an integrated circuit (IC) having a processor operatively coupled to a PVT (process-voltage-temperature) source and an adjustable memory. The processor receives from the source an input characterizing the present PVT condition and generates a command for the memory based on that input. In response to the command, the memory adjusts its internal circuit structure, clock speed, and/or operating voltage(s) to optimize its performance for the present PVT condition. Advantageously, the ability to adjust the memory so that it can maintain its functionality and deliver an acceptable level of performance under unfavorable PVT conditions provides additional flexibility in choosing circuit design options, which can produce area savings and/or increase the yield of acceptable ICs during manufacture.

16 Claims, 6 Drawing Sheets

100

260

960

US 7,948,819 B2

INTEGRATED CIRCUIT HAVING A MEMORY WITH PROCESS-VOLTAGE-TEMPERATURE CONTROL

CROSS-REFERENCE TO RELATED APPLICATIONS

This application claims priority from U.S. Provisional Patent Application No. 60/866,738, filed Nov. 21, 2006, and entitled "Integrated Memory with Speed and PVT Selection Control Inputs."

BACKGROUND OF THE INVENTION

1. Field of the Invention

The present invention relates generally to integrated circuits and, more specifically, to performance optimization based on specific conditions under which an individual integrated circuit is being operated.

2. Description of the Related Art

Integrated memory in fine-line (e.g., 45-nm or 65-nm CMOS) process technologies is aimed to deliver high-quality performance at relatively low power levels and supply voltages. However, intrinsic integrated circuit (IC) characteristics associated with these process technologies make it difficult to design memories that meet these requirements. More specifically, strenuous constraints are imposed on IC design by one or more of local random mismatch of circuit components, relatively high device sub-threshold leakage currents, global process variations, and relatively wide operating temperature and voltage ranges. Disadvantageously, these constraints tend to (i) cause an integrated memory to occupy a relatively large area on the chip, have relatively high power consumption, and have compromised performance and/or (ii) cause the IC yield to be relatively low.

SUMMARY OF THE INVENTION

Certain embodiments of the inventions provide an integrated circuit (IC) or chip having a processor operatively coupled to a PVT (process-voltage-temperature) source and an adjustable memory. The processor receives from the source an input characterizing the present PVT condition and generates a command for the memory based on that input. In response to the command, the memory adjusts its internal circuit structure, clock speed, and/or operating voltage(s) to optimize its performance for the present PVT condition. Advantageously, the ability to adjust the memory so that it can maintain its functionality and deliver an acceptable level of performance under unfavorable PVT conditions provides additional flexibility in choosing circuit design options, which can produce area savings and/or increase the yield of acceptable ICs during manufacture.

According to one embodiment, the present invention is an IC comprising: (i) a source adapted to characterize one or more of process, voltage, and temperature conditions of the IC; (ii) a processor operatively coupled to the source and adapted to receive from the source an input providing the one or more characterized conditions; and (iii) a memory operatively coupled to the processor and adapted to be adjusted in response to a command from the processor, said command being generated based on the one or more characterized conditions.

According to another embodiment, the present invention is a method of operating an IC comprising the steps of: (A) characterizing one or more of process, voltage, and temperature conditions of the IC with a source, wherein the IC comprises: (i) the source; (ii) a processor operatively coupled to the source and adapted to receive from the source an input providing the one or more characterized conditions; and (iii) a memory operatively coupled to the processor; (B) generating, using the processor, a command for the memory based on the one or more characterized conditions; and (C) adjusting the memory in response to said command.

BRIEF DESCRIPTION OF THE DRAWINGS

Other aspects, features, and benefits of the present invention will become more fully apparent from the following detailed description, the appended claims, and the accompanying drawings in which:

DETAILED DESCRIPTION

Certain integrated circuits (ICs) use PVT (process-voltage-temperature) information to enable smart power management of digital circuits, e.g., adaptive and/or dynamic power control. Adaptive power control relies on choosing the clock speed and/or supply voltage based upon the process corner that the electronic device was subject to when manufactured and the IC temperature at which the device is operating. For example, relatively fast processed circuits, which are characterized by the capability of operating at relatively high speeds, can be configured to run at lower supply voltages but still achieve desired operating speeds, thereby reducing excess power drain on the battery. Dynamic power control relies on changing the clock frequency and/or supply voltage going to digital circuits on the fly to respective relatively low (preferably minimum) value(s) that still enable the device to complete a pending task on time. The resulting power savings originate in the $CV^2f$ nature of digital-circuit power consumption, where C is the effective capacitance of the digital circuit, V is the supply voltage, and f is the clock speed.

PVT information may come from real-time sensors embedded within the IC. Alternatively, P (process) information may be measured at some earlier time, e.g., at production testing, and stored in memory storage elements (MSEs). Note that these MSEs are separate and distinct from and not to be confused with other memory circuits described in this specification. Representative examples of smart power management that uses a previous P measurement and storage of P information in non-volatile MSEs can be found, e.g., in commonly owned PCT Application No. PCT/US06/61323, filed on Nov. 29, 2006, which application is incorporated herein in its entirety.

Due to cost-of-manufacture considerations, it is desirable to reduce the silicon area occupied by embedded memory circuits and increase their manufacturing yield. Due to usefulness-in-application considerations, it is desirable to improve performance and reduce power consumption of embedded memory circuits. Therefore, it is desirable to have a memory design that meets both of these objectives.

The present invention takes advantage of on-chip PVT sensing and uses PVT information to configure memory circuits and optimize memory design. More specifically, according to various embodiments of the invention, an IC having an embedded memory is designed to generate a set of control signals that inform the memory of the required speed of operation and/or present PVT condition. Based on those control signals, the embedded memory is (re)configured or speed/PVT "shifted" to be functional, deliver optimal performance, and/or minimize power consumption. Advantageously, embodiments of the invention ease design constraints for the embedded memory, which translates into area savings and/or yield improvements.

Figure 1:
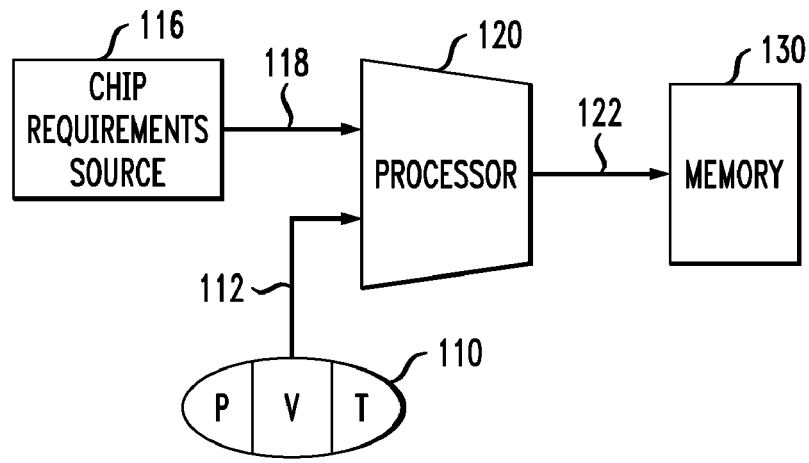
FIG. 1 shows a block diagram of an embedded memory system according to one embodiment of the invention.

FIG. 1 shows a block diagram of an embedded memory system 100 according to one embodiment of the invention. In a representative implementation, system 100 may be part of a larger IC having additional circuit blocks (not shown in FIG. 1). System 100 has a PVT source 110, a processor 120, and an adjustable memory 130. Processor 120 receives signals 112 and 118 that specify the present PVT condition and chip requirements information, respectively. Based on signals 112 and 118, processor 120, via a control signal 122, configures memory 130, e.g., to adjust its circuit structure, operating frequency (clock speed), and/or internally controlled voltages so that (i) the memory is functional under the present PVT conditions and (ii) the performance requirement(s) are met while the power consumption is kept at a relatively low level.

Chip performance requirements provided via signal 118 can include one or more of the following: a clock speed, a time constraint for a particular task to be run by system 100, a mode of operation, one or more internally (i.e., from within the memory) generated voltages, e.g., those generated by charge pumps or voltage regulators, etc. As an example, if system 100 is embedded within a cell phone chip, then signal 118 can specify that the cell phone is now in a standby mode or in an active (voice-data streaming) mode. Using signal 122, processor 120 can then configure memory 130 to deliver a level of performance that is optimal for the specified mode. If the required frequency is relatively low, then the row driver devices within memory 120 may be reduced in size to conserve both active and static power. Alternatively, if the performance demand by the chip is relatively high, then the row voltage within memory 120 can be boosted to a higher level to achieve shorter memory cycle times. For these situations, the net effect of using the information provided by signals 112 and 118 is to minimize power consumption and maximize performance consistent with the present chip requirements. In a cell phone, system 100 helps to maintain long battery life while enabling features requiring high memory performance.

PVT source 110 is designed to provide information about the silicon process, chip temperature, and voltage. In one embodiment, the voltage (V), temperature (T), and process (P) information is generated by respective sensors located within the chip. Process sensing is known in the art and typically determines characteristics of the chip's transistors of one or more types and sizes. Exemplary transistor characteristics can be one or more of the transistor threshold voltage, saturation current in the ON-state, and leakage current in the OFF-state. N-and P-channel transistors may or may not be sensed separately. The determined transistor characteristics can optionally be pre-processed to generate a generalized process metric for the chip.

Alternatively or in addition, process (P) information may be sensed by measuring the speed of a relatively simple reference circuit, such as the frequency of a ring oscillator. Yet another process (P) information source can be the above-described MSEs, in which process (P) information has already been stored (for details, see the above-cited PCT Application No. PCT/US06/61323). Process-related parameters stored in the MSEs may or may not be the same as those obtained via on-chip P sensing.

A temperature reading obtained by PVT source 110 is provided to processor 120 as part of signal 112. Since the temperature effect on the operation of the chip in general and memory 130 in particular is known, the received temperature parameter enables processor 120 to take temperature variations into account in the determination of an optimal configuration for memory 130.

A voltage reading obtained by PVT source 110 characterizes one or more voltages applied to system 100 by off-chip circuits, e.g., an external power supply, or by on-chip circuits, e.g. a charge pump or voltage regulator. Note that system 100 may also use one or more not-sensed, chip-controlled voltages that need to be distinguished from the externally supplied voltages that are characterized by PVT source 110. Hereafter, these not-sensed, chip-controlled voltages are referred to as chip-controlled voltages.

Chip-controlled voltages may have different values than the externally supplied voltages. On-chip voltage reduction is usually performed to reduce power consumption, a technique well known in the art. On-chip voltage increase above external supply voltages, typically generated with charge pump circuits, may be used to increase memory performance while maintaining other power supplies, external or embedded, at lower levels. Chip-controlled voltage values may be input to processor 120 via signal 118.

Table 1 shows examples of various inputs, both from PVT source 110 and chip-controlled, that processor 120 may use to appropriately configure memory 130.

TABLE 1

Examples of Inputs Used by Processor 120

| | Variables | Range | |
|---|---|---|---|
| PVT Source (sensed or stored) | Process N-channel device speed | "Slow" | "Fast" |
| | Process P-channel device speed | "Slow" | "Fast" |
| | Frequency of operation metric | Frequency range | |
| PVT Source (sensed) | Voltage | 0.8 V | 1.5 V |
| | Temperature | −40 C. | 125 C. |
| Chip-Controlled | Clock Speed | 60 MHz | 300 MHz |
| | Controlled Voltage | 0.7 V | 1.2 V |

Table 1 is not exhaustive. Other process parameters may be measured, for example, N-channel and/or P-channel threshold voltage(s), ON-state conductance and/or OFF-state leakage current. The ranges shown in Table 1 are exemplary and are not to be construed as limiting the processing range of processor 120 and/or dynamic range of PVT source 110. The ranges for N-and P-channel transistors may be expressed in picoseconds, MHz, or any other suitable quantitative units.

Processor 120 is designed to process the inputs provided via signals 112 and 118 and, based on the processing results, generate signal 122, which enables memory 130 to make appropriate internal adjustments and optimize its operation for the specific PVT conditions and chip performance requirements. In one embodiment, processor 120 is a shared processor that is also used for other functions, such as power control, speed stepping, and/or data processing. In another embodiment, processor 120 is a dedicated processor that controls memory adjustments. In the latter embodiment, processor 120 may be part of memory 130, e.g., a logic circuit embedded within the memory macro.

Memory 130 is designed to use signal 122 to optimize operation, performance, and power consumption according to the existing PVT conditions and chip requirements. For example, based on signal 122 and using pre-defined criteria, memory 130 can adjust its effective circuit structure, operating frequency, and voltage biases. Memory performance parameters that can be optimized include, but are not limited to, active and/or standby power consumption, frequency of operation, and ability to function at low or high voltage.

Representative examples of an adjustable memory that can be used as memory 130 are disclosed in, e.g., U.S. Pat. Nos. 7,193,910 and 7,130,227, both of which are incorporated herein by reference in their entirety. Briefly, an adjustable memory may have an adjustable timing circuit having non-volatile programmable fuses and adjustable delay elements. Signal propagation time through a critical timing path is controlled with non-volatile programmable fuses of delay elements inserted into that critical path. For example, one or more capacitors of the delay element can be selectively and controllably coupled to or decoupled from the critical timing path, thereby changing the effective signal propagation time through the delay element and, hence, through the critical timing path having that delay element. Similarly, non-volatile programmable fuses can be used to selectively and controllably engage or disengage sections (modules) of a modular device, e.g., a transistor, thereby changing the effective device size.

Figure 2:
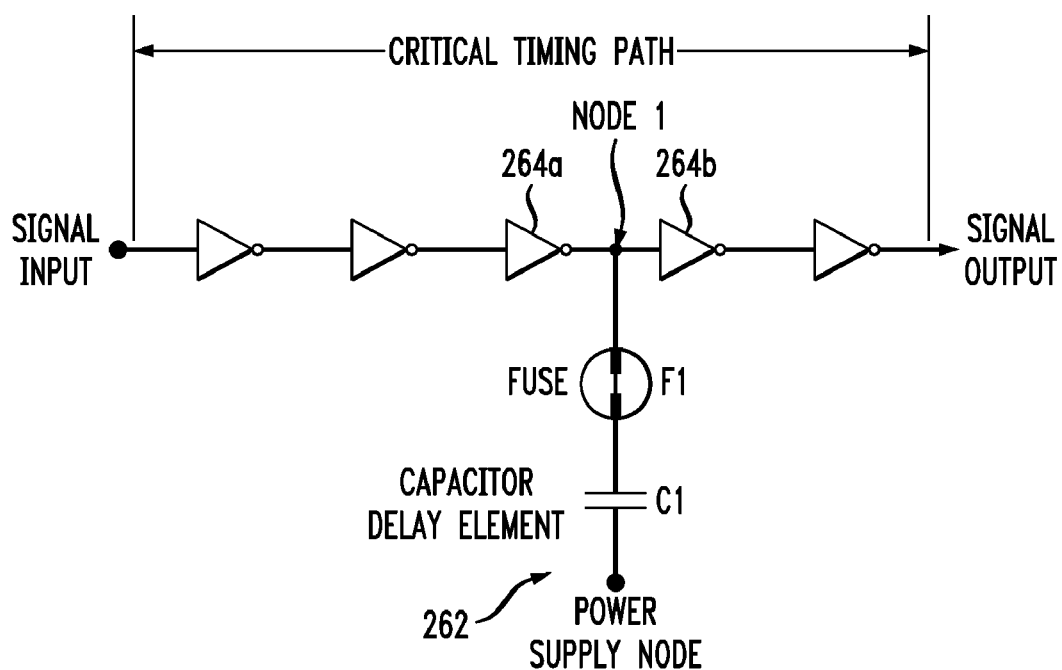
FIG. 2 shows a critical timing path that can be present in a generic adjustable memory.
Figure 3:
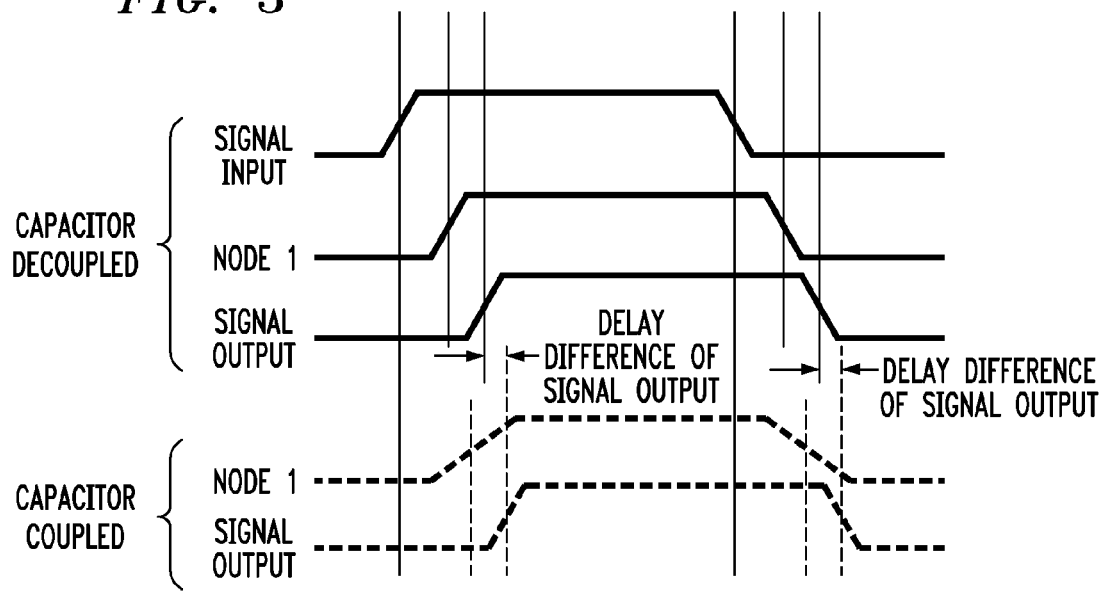
FIG. 3 graphically illustrates signal propagation delay changes through the path of FIG. 2.
Figure 4:
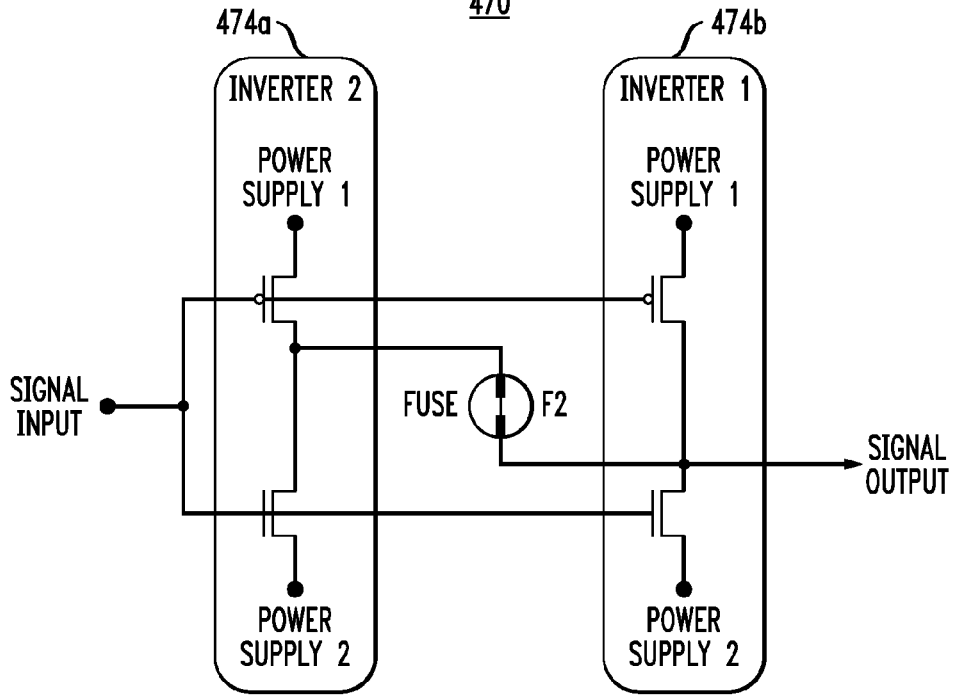
FIG. 4 shows a modular device that can be used in a generic adjustable memory.
Figure 5:
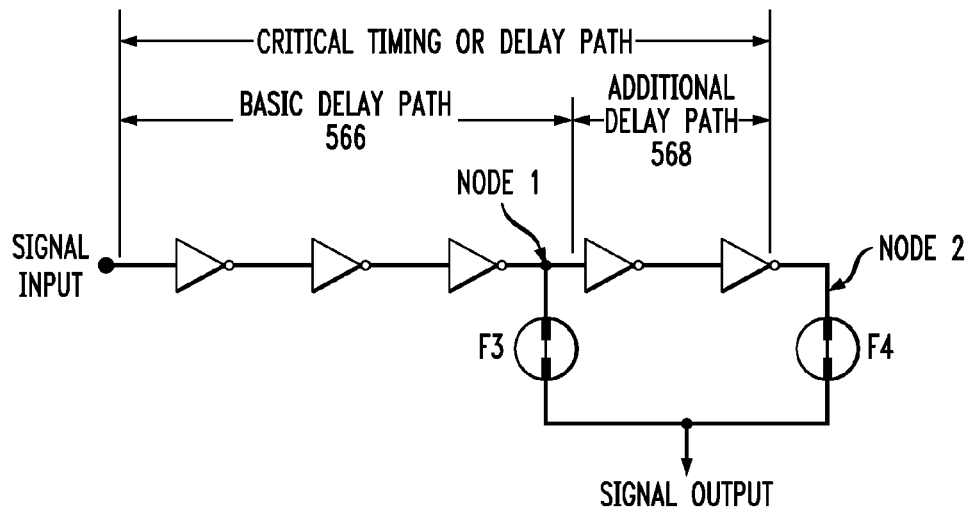
FIG. 5 shows a critical timing or delay path that can be present in a generic adjustable memory.
Figure 6:
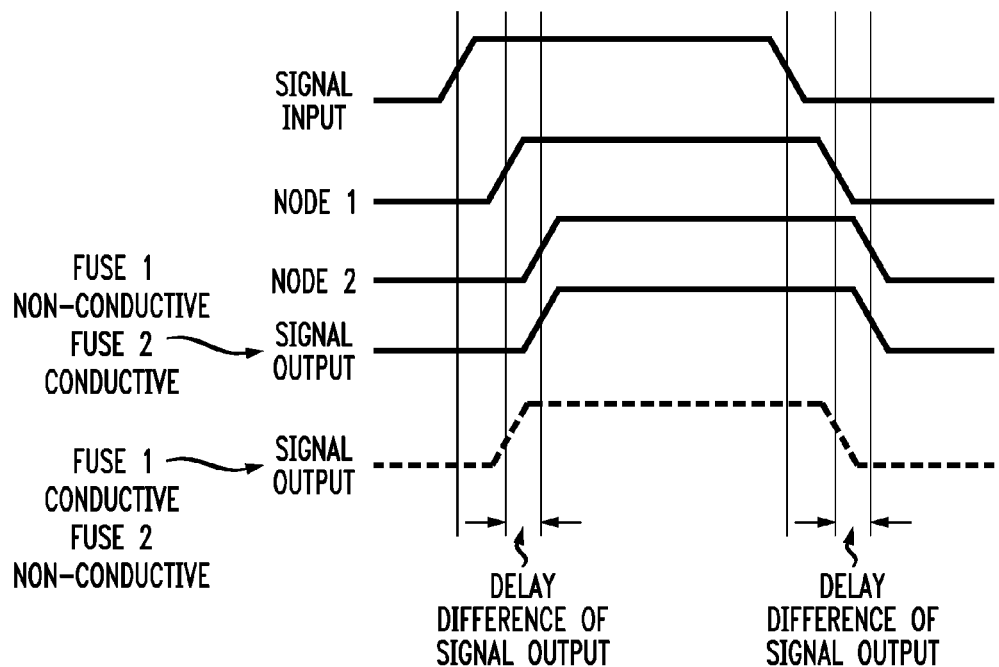
FIG. 6 graphically illustrates signal propagation delay changes through the path of FIG. 5.
Figure 7:
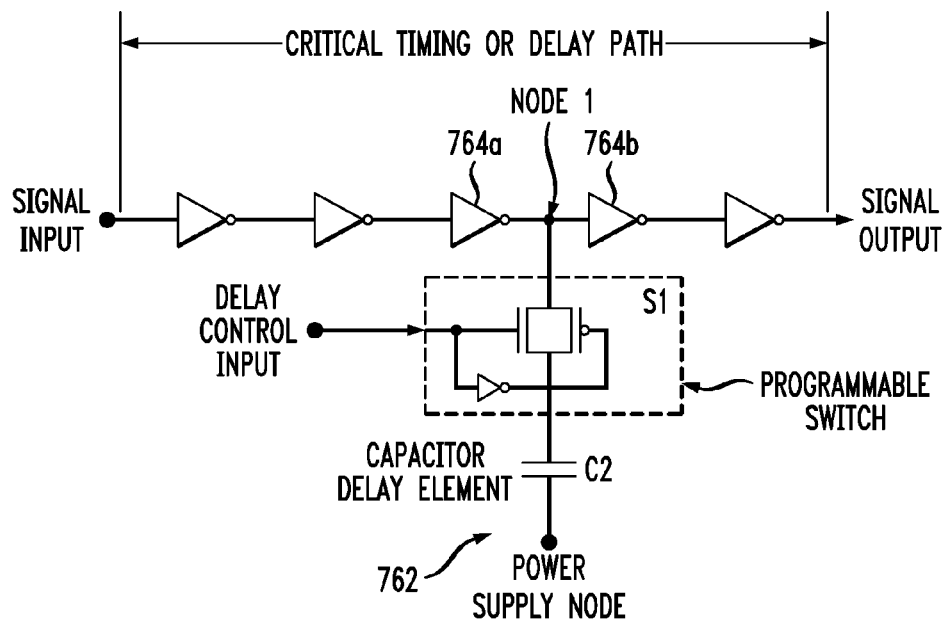
FIG. 7 shows a critical timing or delay path that can be present in the memory of the memory system shown in FIG. 1 according to one embodiment of the invention.
Figure 8:
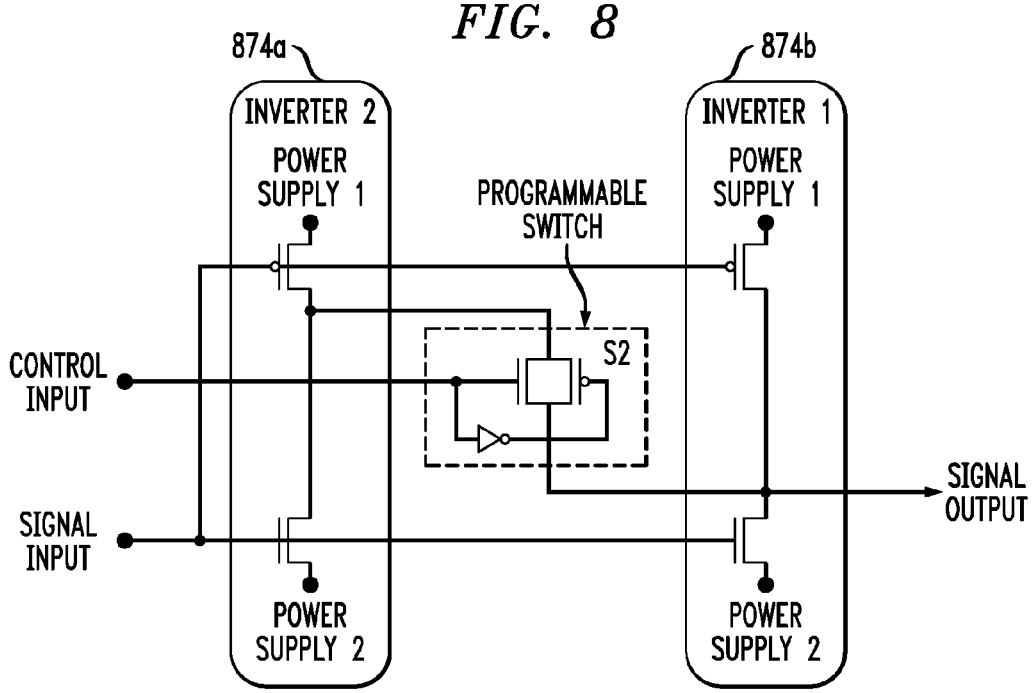
FIG. 8 shows a modular device that can be used the memory of the memory system shown in FIG. 1 according to another embodiment of the invention.
Figure 9:
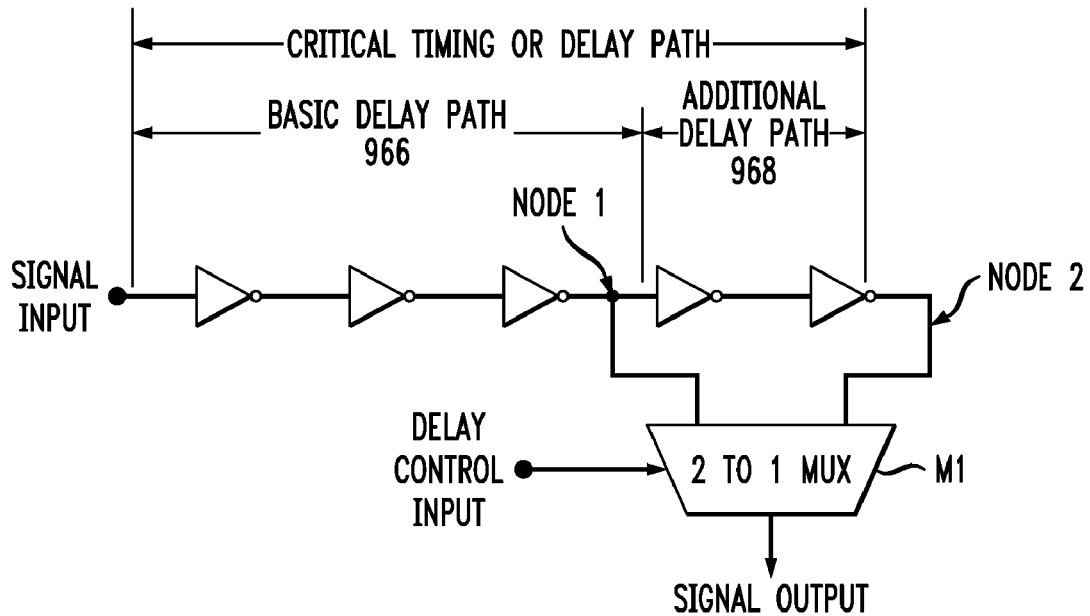
FIG. 9 shows a critical timing or delay path that can be present in the memory of the memory system shown in FIG. 1 according to yet another embodiment of the invention.

FIGS. 2, 4, and 5 show representative circuits that can be used in a generic adjustable memory. FIGS. 3 and 6 graphically show the operation of the circuits shown in FIGS. 2 and 5, respectively, in different fuse configurations. FIGS. 7-9 provide further details on illustrative embodiments of memory 130, which embodiments utilize and extend the approaches illustrated by FIGS. 2-6.

FIG. 2 shows a critical timing path 260 that can be present in a generic adjustable memory. Path 260 has a delay element 262 comprising capacitor C1 and non-volatile programmable fuse F1. Capacitor C1 can be selectively and controllably coupled between inverters 264a and 264b or decoupled there from by appropriately configuring fuse F1. Coupling or decoupling of capacitor C1 changes the effective signal propagation time between inverters 264a and 264b, which also changes the total signal propagation time through path 260. One skilled in the art will appreciate that path 260 can have multiple delay elements analogous to delay element 262.

FIG. 3 graphically illustrates signal propagation delay changes through path 260 with capacitor C1 coupled and decoupled.

FIG. 4 shows a modular device 470 that can be used in a generic adjustable memory. Device 470 has non-volatile programmable fuse F2 configured between device modules 474a and 474b, which are illustratively shown as inverters. In a different embodiment, modules 474a and 474b can be, e.g., transistor modules. Fuse F2 can be used to selectively and controllably engage or disengage modules 474a and 474b, which changes the effective size of device 470. As an illustration, FIG. 4 shows a configuration in which fuse F2 can be used to add inverter 2 to inverter 1 to strengthen the output drive of the composite inverter. When fuse F2 is conductive, inverter 2 is coupled to assist inverter 1 in driving the output.

FIG. 5 shows a critical timing or delay path 560 that can be present in a generic adjustable memory. Path 560 has a basic path 566 and an additional path 568. With fuses F3 and F4 conducting and non-conducting, respectively, path 568 is bypassed by the propagating signal. In contrast, with fuses F3 and F4 non-conducting and conducting, respectively, the propagating signal passes through both paths 566 and 568.

FIG. 6 graphically illustrates signal propagation delay changes through path 560 with additional path 568 engaged and disengaged.

Table 2 lists exemplary conditions indicated by signals 112 and 118, the corresponding configuration changes effected within memory 130 based on signal 122, and respective benefits of those changes.

TABLE 2

Exemplary Configuration Changes for Memory 130

| Condition Indicated by Signals 112/118 | Memory Adjustment | Benefit |
| --- | --- | --- |
| Fast N-channel process | 1. Reduce large device pull-down size<br>2. Adjust critical circuitry P/N device ratio<br>3. Circuit configuration changes | Reduce power consumption; maintain functionality and performance |
| Fast P-channel process | 1. Reduce large device pull-up size<br>2. Adjust critical circuitry P/N device ratio<br>3. Circuit configuration changes | Reduce power consumption; maintain functionality and performance |
| Reduced voltage to memory | 1. Increase critical device sizes<br>2. Adjust critical timing paths | Maintain functionality and performance |
| Increased voltage to memory | 1. Reduce large device sizes<br>2. Adjust critical timing paths | Reduce power consumption; maintain functionality and performance |
| Very low temperature | Adjust circuitry to compensate for high device thresholds | Maintains functionality and performance |
| High temperature and high voltage | Change circuits to reduce current leakage | Reduces power consumption |
| Low clock speed | Reduce large device sizes | Reduces power consumption |

As indicated in Table 2, exemplary adjustments of memory 130 include circuit configuration changes, such as device-size changes and adjustment of critical timing paths. Circuit configuration changes may further include inclusion or exclusion of circuit blocks or signal paths. These circuit configuration changes can be implemented through activation or deactivation of internal switches that control internal circuit wiring and/or inclusion/exclusion of various electrical devices, such as transistors, capacitors, resistors, and inductances. The primary benefits of these memory adjustments include, but are not limited to, reduced power consumption and an ability to provide required functionality over wider ranges of process, temperature, and voltage compared to those of the corresponding prior-art ICs.

FIG. 7 shows a critical timing or delay path 760 that can be present in memory 130 according to one embodiment of the invention. Path 760 has a delay element 762 comprising capacitor C2 and programmable switch S1. Capacitor C2 can be selectively and controllably coupled between inverters 764a and 764b or decoupled there from by appropriately configuring switch S1. Coupling or decoupling of capacitor C2 changes the effective signal propagation time between inverters 764a and 764b, which also changes the total signal propagation time through path 760. One skilled in the art will appreciate that path 760 can have multiple delay elements analogous to delay element 762. The state of switch S1 is controlled by the delay control input which is coupled to output 122 of processor 120 (see FIG. 1). In one embodiment, programmable switch S1 can be part of a control circuit 1050 (see FIG. 10).

FIG. 8 shows a modular device 870 that can be used in memory 130 according to another embodiment of the invention. Device 870 has programmable switch S2 configured between device modules 874a and 874b, which are illustratively shown as inverters. In a different embodiment, modules 874a and 874b can be, e.g., transistor modules. Switch S2 can be used to selectively and controllably engage or disengage modules 874a and 874b, which changes the effective size of device 870. As an illustration, FIG. 8 shows a configuration in which switch S2 can be used to add inverter 2 to inverter 1 to strengthen the output drive of the composite inverter. The state of switch S2 is controlled by the control input which is coupled to output 122 of processor 120 (see FIG. 1). In one embodiment, programmable switch S2 can be part of control circuit 1050 (see FIG. 10).

FIG. 9 shows a critical timing or delay path 960 that can be present in memory 130 according to yet another embodiment of the invention. Path 960 has a basic path 966 and an additional path 968. Depending on the state of multiplexer M1, path 968 is bypassed or traversed by the propagating signal. The state of multiplexer M1 is controlled by the delay control input which is coupled to output 122 of processor 120 (see FIG. 1). In one embodiment, multiplexer M1 can be part of control circuit 1050 (see FIG. 10).

Figure 10:
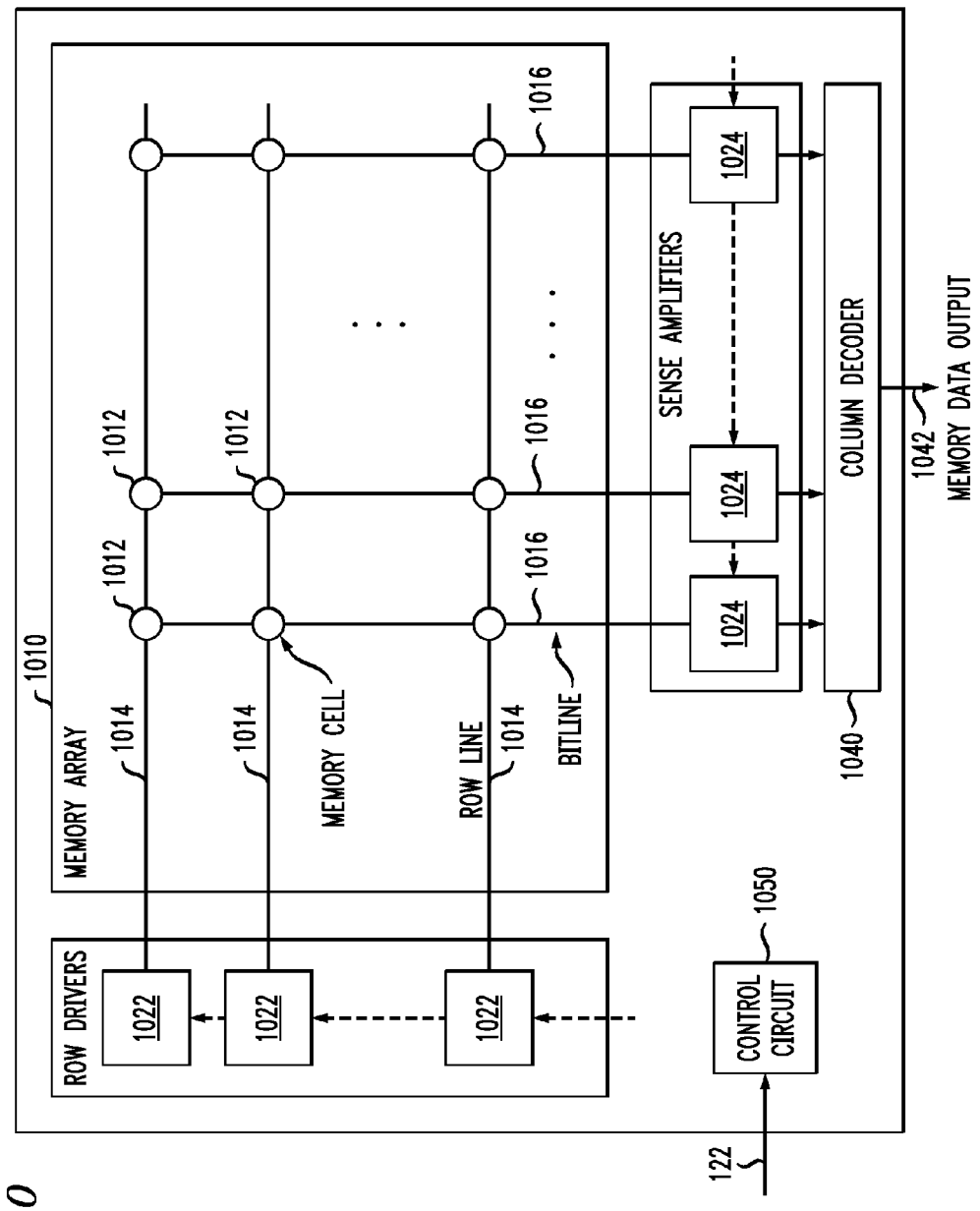
FIG. 10 shows a block diagram of an adjustable memory that can be used in the system of FIG. 1 according to one embodiment of the invention.

FIG. 10 shows a block diagram of an adjustable memory 1030 that can be used as memory 130 according to one embodiment of the invention. Memory 1030 has an array 1010 of memory cells 1012 arranged in rows and columns. To read from a selected memory cell 1012, memory 1030, using a respective row driver 1022, activates (turns on) a respective row line 1014, thereby turning on the transistors (not shown) that connect each memory cell in that row to a corresponding bit line 1016. Each of bit lines 1016 leads to a respective sense amplifier 224 that latches the value stored in the activated memory cell and transfers it, via a column decoder 1040, to a memory output 1042. To write to a selected memory cell 1012, memory 1030 similarly activates (turns on) a respective row line 1014 and then latches the signal to be stored in the memory cell onto the respective bit line 1016.

Memory 1030 further includes control circuit 1050 that is adapted to control the internal timing such as that of the above-described read and write operations. More specifically, based on control signal 122 generated by processor 120 (see FIG. 1), control circuit 1050 can adjust the time delay between when the selected row line 1014 is turned on and when sense amplifiers 1024 latch the respective signals that appear on bit lines 1016. During this time delay, the row transitions from the OFF state to the ON state, memory cells 1012 along the selected row line are activated, and signals develop on bit lines 1016. Table 3 summarizes the timing of this sequence.

TABLE 3

Exemplary Timing of Events in Memory 1030

| | Specific Event | Control of Timing |
|---|---|---|
| Events between row-line and bit-line activation | Row driver 1022 activated | Timing control circuit 1050 |
| | Voltage on row line 1014 rises to high level | Self timed |
| | memory cells 1012 in the row activated | Self timed |
| | Signals develop on bit lines 1016 | Self timed |
| | Sense amplifiers 1024 latch | Timing control circuit 1050 |

If the operating voltage is relatively low, e.g., 0.8 V, then the signal transition on row line 1014 from low to high and the signal development on bit lines 1016 are relatively slow. In this situation, processor 120, via control signal 122, may configure control circuit 1050 to increase the delay time between the activation of row driver 1022 and the latching of sense amplifiers 1024. Control circuit 1050 can also make appropriate timing adjustments to take into account chip-to-chip process variations and chip temperature fluctuations, as specified by signal 112, and performance requirements, as specified by signal 114.

Furthermore, a temperature decrease generally causes transistor thresholds to increase. The increased thresholds result in a corresponding increase in the time that inverters (e.g., those used in row drivers 1022 and sense amplifiers 1024, not explicitly shown in FIG. 10) need to be able to drive their respective loads to a new state. This effect becomes especially pronounced if both the operating voltage and temperature are relatively low. In this case, in addition to or instead of the delay time adjustments, processor 120 may instruct control circuit 1050 to increase selected device sizes. As already indicated above, control circuit 1050 can switch in additional sections of one or more modular devices, e.g., transistors used in memory 1030, thereby increasing the effective device size and correspondingly decreasing the time that is needed for the inverters to appropriately drive their respective loads. Processor 120 may instruct control circuit 1050 to reverse these changes, e.g., switch out some modules to decrease the effective device size if the voltage and temperature conditions become more favorable.

In addition to providing reductions in power consumption and the ability to maintain functionality and performance under unfavorable PVT conditions, embodiments of the present invention advantageously provide means for reducing the circuit area and/or enhancing the yield of acceptable ICs during manufacture. More specifically, memories are typically designed to operate within a specified voltage range, typically ±10% around a nominal voltage. For example, with a nominal voltage of 1 V, the voltage range would be from about 0.9 V to about 1.1 V. At manufacture, there typically is some yield loss due to IC failure to properly operate at or near the voltage boundaries, particularly at or near the lower voltage boundary. To obtain a relatively high yield, one typical prior-art approach is to increase device sizes and/or circuit complexity to provide a physical structure that will be functional even under the worst-case PVT conditions, typically low voltage, high temperature, and slow process. This prior-art approach disadvantageously tends to increase the circuit area.

In contrast, the ability to adjust memory 130 (FIG. 1) or memory 1030 (FIG. 10) in terms of circuit structure, timing, device sizes, and/or internal voltages (biases) gives more flexibility in choosing design options. For example, the ability to adjust timing delays and increase voltages enables memory 1030 to use relatively small driver devices, e.g., for row drivers 1022. More specifically, instead of using bigger (more powerful) row drivers (which would be a prior-art approach), memory 1030 can use relatively small (less powerful) row drivers 1022 and be adjusted as described above to still have an appropriate delay time between the activation of a row driver and the latching of sense amplifiers 1024. Thus, the flexibility in choosing design options can advantageously result in area savings. Similarly, the ability to adjust memory 1030 so that it can maintain its functionality and deliver an acceptable level of performance under unfavorable PVT conditions advantageously increases the yield of acceptable ICs during manufacture. Furthermore, the flexibility in choosing design options can advantageously reduce power consumption when the processing is fast, when temperatures are low, and/or when voltage is high.

While this invention has been described with reference to illustrative embodiments, this description is not intended to be construed in a limiting sense. Various modifications of the described embodiments, as well as other embodiments of the invention, which are apparent to persons skilled in the art to which the invention pertains are deemed to lie within the principle and scope of the invention as expressed in the following claims.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Although transistors have been described as single devices, it should be understood by those with skill in the art that transistors will have various sizes (e.g., gate width and length) and characteristics (e.g., threshold voltage, gain, etc.) and may consist of multiple transistors coupled in parallel to get desired electrical characteristics from the combination. The same principles may also apply to other circuit elements, e.g., capacitors, resistors, and inductances.

We claim:

1. An integrated circuit (IC), comprising:
    a source adapted to characterize one or more of process, voltage, and temperature conditions of the IC;
    a processor operatively coupled to the source and adapted to receive from the source an input providing the one or more characterized conditions; and
    a memory operatively coupled to the processor and adapted to be adjusted in response to a command from the processor, said command being generated based on the one or more characterized conditions, wherein:
        the memory is adapted to adjust its effective circuit structure in response to said command;
        said structure adjustment comprises an inclusion or exclusion of a transistor module of a modular transistor;
        the modular transistor comprises a first transistor module and a second transistor module connected in parallel to one another so that a gate of the first transistor module and a gate of the second transistor module are both connected to a signal-input terminal;
        the IC comprises a first programmable switch configured between the first transistor module and the second transistor module to controllably engage or disengage the second transistor module with the first transistor module, said first programmable switch being controlled in response to the command;
        in a first state of the first programmable switch, a signal-output terminal of the modular transistor is connected to the first transistor module but not the second transistor module; and
        in a second state of the first programmable switch, the signal-output terminal of the modular transistor is connected to both the first transistor module and the second transistor module.

2. The invention of claim 1, wherein:
    said structure adjustment further comprises an adjustment of a timing path;
    the IC comprises a second programmable switch configured between the timing path and a capacitor, said second programmable switch being controlled in response to the command;
    in a first state of the second programmable switch, the capacitor is coupled to the timing path;
    in a second state of the second programmable switch, the capacitor is decoupled from the timing path; and
    the coupling and decoupling of the capacitor changes signal propagation time through the timing path.

3. The invention of claim 1, wherein the memory comprises:
    an array of memory cells organized in rows and columns, wherein each row is connected to a respective row line and each column is connected to a respective bit line;
    a plurality of row drivers, each adapted to activate a respective row line;
    a plurality of sense amplifiers, each adapted to latch a signal onto or from a respective bit line; and a control circuit adapted to change, in response to said command, a delay time between activation of a selected row driver and latching of the sense amplifiers.

4. The invention of claim 1, wherein:
the processor is further adapted to receive an input specifying chip-requirement information;
the chip-requirement information includes one or more of a clock speed, a time constraint for a task to be run by the IC, a mode of operation, and one or more values for voltages generated by a charge pump or a voltage regulator that is part of the IC; and
said command is generated based on the chip-requirement information.

5. The invention of claim 4, wherein the processor is adapted to generate said command to optimize operation of the memory for the one or more provided conditions and the chip-requirement information.

6. The invention of claim 5, wherein said optimization comprises optimization of power consumption.

7. The invention of claim 1, wherein the source comprises a sensor adapted to sense the one or more of process, voltage, and temperature conditions.

8. The invention of claim 1, wherein the processor is a shared processor that is further adapted to perform power control and speed stepping.

9. The invention of claim 1, wherein the processor is a shared processor that is further adapted to perform data processing.

10. The invention of claim 1, wherein the source comprises memory storage elements adapted to provide the process conditions.

11. The invention of claim 10, wherein the process conditions include transistor characteristics.

12. The invention of claim 10, wherein the process conditions include digital circuit speed performance.

13. The invention of claim 1, wherein the first transistor module and the second transistor module are parts of a modular inverter.

14. A method of operating an integrated circuit (IC), comprising:
characterizing one or more of process, voltage, and temperature conditions of the IC with a source, wherein the IC comprises:
the source;
a processor operatively coupled to the source and adapted to receive from the source an input providing the one or more characterized conditions; and
a memory operatively coupled to the processor;
generating, using the processor, a command for the memory based on the one or more characterized conditions; and
adjusting the memory in response to said command, wherein:
the step of adjusting comprises adjusting an effective circuit structure of the memory in response to said command; and
said structure adjustment comprises an inclusion or exclusion of a transistor module of a modular transistor;
the modular transistor comprises a first transistor module and a second transistor module connected in parallel to one another so that a gate of the first transistor module and a gate of the second transistor module are both connected to a signal-input terminal;
the IC comprises a first programmable switch configured between the first transistor module and the second transistor module to controllably engage or disengage the second transistor module with the first transistor module, said first programmable switch being controlled in response to the command;
in a first state of the first programmable switch, a signal-output terminal of the modular transistor is connected to the first transistor module but not the second transistor module; and
in a second state of the first programmable switch, the signal-output terminal of the modular transistor is connected to both the first transistor module and the second transistor module.

15. The invention of claim 14, wherein:
said structure adjustment further comprises an adjustment of a timing path;
the IC comprises a second programmable switch configured between the timing path and a capacitor, said second programmable switch being controlled in response to the command;
in a first state of the second programmable switch, the capacitor is coupled to the timing path;
in a second state of the second programmable switch, the capacitor is decoupled from the timing path; and
the coupling and decoupling of the capacitor changes signal propagation time through the timing path.

16. The invention of claim 14, wherein the first transistor module and the second transistor module are parts of a modular inverter.

* * * * *